(12) United States Patent
Kye

(10) Patent No.: US 6,489,068 B1
(45) Date of Patent: Dec. 3, 2002

(54) PROCESS FOR OBSERVING OVERLAY ERRORS ON LITHOGRAPHIC MASKS

(75) Inventor: Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/790,135

(22) Filed: Feb. 21, 2001

(51) Int. Cl.⁷ .................................................. G03F 9/00
(52) U.S. Cl. ........................... 430/22; 430/30; 382/144; 382/151
(58) Field of Search ..................... 430/22, 30; 382/144, 382/151

*Primary Examiner*—Christopher G. Young
(74) *Attorney, Agent, or Firm*—Foley & Lardner

(57) ABSTRACT

A method of observing overlay errors associated with two masks or reticles includes providing alignment marks to a substrate. The alignment marks can be observed to determine overlay errors. In one embodiment, the lightness or darkness of the alignment marks can indicate an overlay error. The technique can be utilized in any photolithographic system including an EUV, VUV, DUV or conventional patterning device.

20 Claims, 8 Drawing Sheets

PROCESS FOR OBSERVING OVERLAY ERRORS ON LITHOGRAPHIC MASKS

FIELD OF THE INVENTION

The present specification relates to the fabrication of integrated circuits (ICs). More specifically, the present specification relates to a process of observing alignment or overlay errors associated with tools utilized in IC fabrication. The present specification also relates to alignment patterns for such a process.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FETs). Despite the ability of conventional systems and processes to fabricate millions of devices on an IC, there is still a need to increase the number of devices on an IC.

The increased demand for higher performance integrated circuit (IC) devices has required a higher density of transistors and other components on the IC substrate. The increased density of components, in turn, has required an increase in the number of the layers associated with the IC. Further, as devices have become more complicated, each layer often includes a number of levels of material. For example, a flash memory cell can include a floating gate structure with five or more different levels of material (a gate dielectric, a floating gate, an ONO layer, a control gate, and a silicon layer).

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation illuminates selected areas of the surface through an intervening master template, the mask, for a particular pattern. The radiation can be light, such as ultra-violet light, vacuum ultra-violet (VUV) light and deep ultra-violet light. The radiation can also be x-ray radiation, e-beam radiation, etc.

The photoresist material or layer associated with conventional lithographic technologies is often utilized to selectively form various IC structures, regions, and layers. Generally, the patterned photoresist material can be utilized to define doping regions, deposition regions, etching regions, or other structures associated with an integrated circuit (IC). A conventional lithographic system is generally utilized to project the pattern to the photoresist material or layer. The photoresist material may be either a positive or a negative photoresist layer.

Registering or aligning the image of one level or layer on an IC to a previously etched, doped, or deposited level or layer of the IC is a significant factor in producing small IC device features. The pattern of the previous level or layer must match (be aligned with) the pattern being formed. When a level or layer is not perfectly aligned, an overlay or alignment error exists and the IC may not function properly. In fact, a limiting characteristic of process fabrication is the aligner fabrication capability, e.g., the overlay accuracy, and machine-to-machine repeatability. The aligner fabrication capability can often be more important to IC fabrication than line width control.

Registration, overlay or alignment errors can be due to several factors. For example, reticles or masks may include overlay errors with respect to each other. In other words, the reticles or masks are not aligned to each other. With this type of overlay error, it is very difficult to realign the masks or reticles through conventional corrective action. Overlay or alignment errors can also be caused by temperature differences between times of exposure, which can cause mask or reticle expansion or contraction so that even perfectly manufactured reticles are not in alignment during IC fabrication. Yet further, alignment tools can often have limited registration capabilities, thereby being another source of alignment errors.

Heretofore, conventional techniques have utilized a rectangle within rectangle (box in a box) technique to measure overlay errors and registration tolerance. According to one conventional technique, a larger rectangle is formed on a previous layer of the IC. A smaller rectangle is formed on a subsequent layer of the IC. If the layers are in alignment, then the smaller rectangle falls within the larger rectangle with appropriate nesting tolerances.

Such nested rectangles can be observed by various conventional inspection equipment. For example, optical inspection equipment can view the larger rectangle and smaller rectangle to ensure that appropriate overlay accuracy has been achieved. However, the use of such equipment adds to the manufacturing time associated with the fabrication of the IC. The overlay measurement requires that the wafer be removed from the commercial semiconductor fabrication equipment and viewed in an inspection tool.

Thus, there is a need to pattern IC devices without requiring complicated overlay error inspections. Further, there is a need to more easily detect overlay errors associated with reticle or mask misalignment. Yet further, there is a need for an alignment pattern which can indicate an overlay error to the naked eye.

SUMMARY OF THE INVENTION

An exemplary embodiment relates to a method of observing alignment errors between a first mask or reticle and a second mask or reticle. The first mask or reticle and the second mask or reticle are used in fabricating an integrated circuit. The method includes steps of providing a photoresist layer over a semiconductor substrate, providing a first pattern of radiation to the photoresist layer with the first mask or reticle, providing a second radiation to the photoresist layer with the second mask or reticle, developing the photoresist layer to reveal a plurality of wafer alignment marks, and observing the darkness of the wafer alignment marks.

The first pattern of radiation includes a plurality of first alignment marks. The second pattern of radiation includes a plurality of second alignment marks. The wafer alignment marks are related to a combination of the first alignment marks and the second alignment marks.

Another exemplary embodiment relates to a method of determining an overlay error between a pair of masks or reticles used to fabricate an integrated circuit. The method includes providing a pattern of radiation to a substrate with a first mask or reticle, and providing a pattern of radiation to the substrate with a second mask or reticle. The method also includes providing a plurality of alignment features on the substrate. The alignment features are related to the first mask or reticle and the second mask or reticle. A characteristic of the alignment features can be observed via the naked eye to determine the overlay error between the first mask or reticle and the second mask or reticle.

Still another exemplary embodiment relates to a method of determining an overlay error with the naked eye between a first mask or reticle and a second mask or reticle. The first mask or reticle and the second mask or reticle are utilized to fabricate an integrated circuit. The method includes forming a set of alignment marks on a substrate and observing the darkness characteristic of the alignment marks with the naked eye. The alignment marks are related to alignment patterns associated with the first mask or reticle and the second mask or reticle. The set of alignment marks have a darkness characteristic related to the overlay error.

BRIEF DESCRIPTION OF THE DRAWINGS

The exemplary embodiments will hereafter be described with reference to the accompanying drawings, wherein like numerals denote like elements, and.

DETAILED DESCRIPTION OF PREFERRED EXEMPLARY EMBODIMENTS

Figure 1:
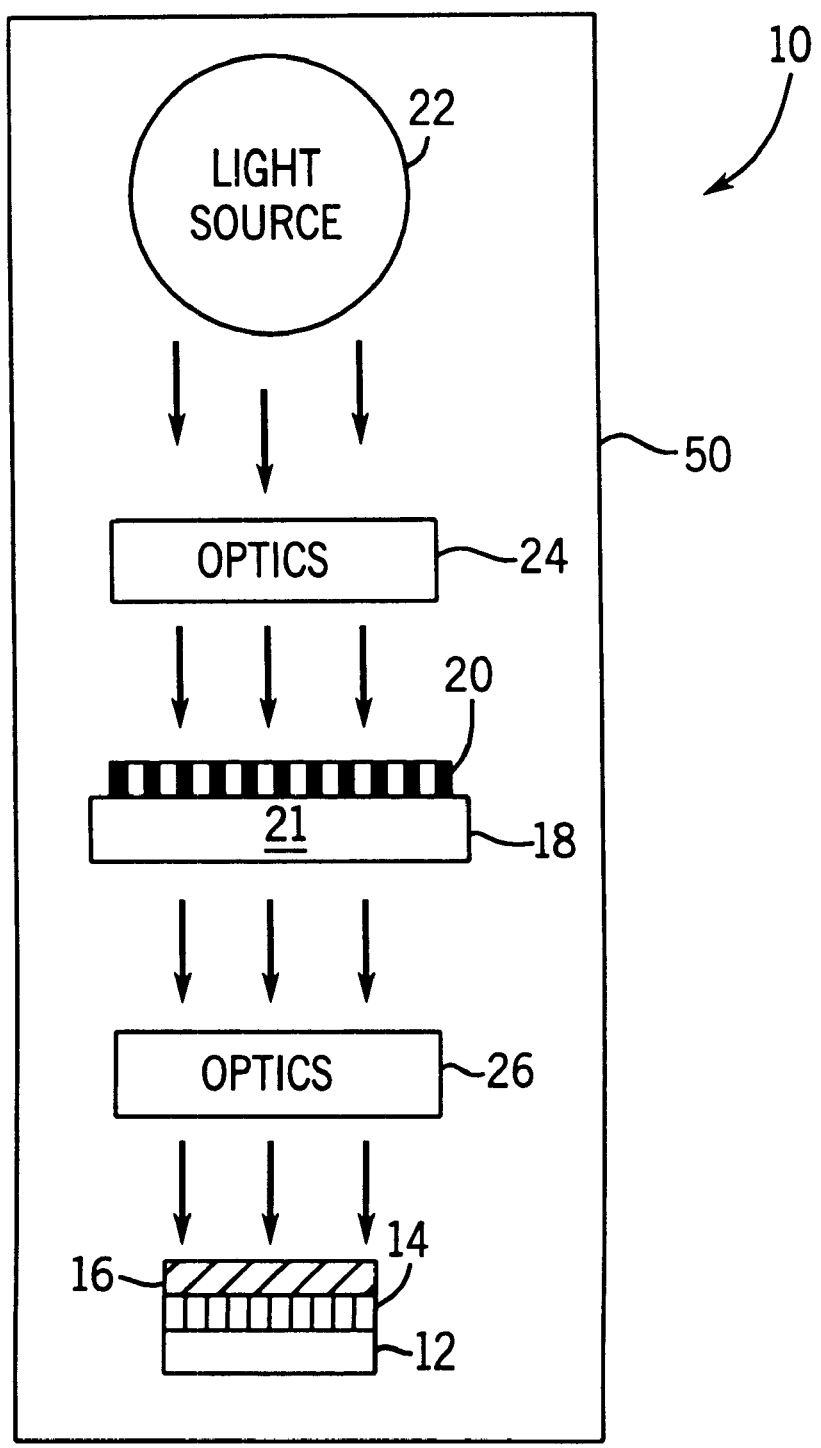
FIG. 1 is a general schematic block diagram of a lithographic system for patterning a wafer in accordance with an exemplary embodiment.

Referring to FIG. 1, a substrate 12 is shown in a lithographic system 10. Substrate 12 can be a semiconductor substrate, such as, silicon, gallium arsenide, germanium, or other substrate material. Substrate 12 can include one or more layers of material and/or features, such as, lines, interconnects, vias, doped portions, etc., and can further include devices, such as, transistors, microactuators, microsensors, capacitors, resistors, diodes, etc. Substrate 12 can be an entire integrated circuit (IC) wafer or part of an IC wafer. Substrate 12 can be part of an IC, such as, a memory, a processing unit, an input/output device, etc.

Lithographic system 10 provides a pattern of radiation to substrate 12. System 10 can include a chamber 50. Chamber 50 can be a vacuum or low pressure chamber for use in vacuum ultra-violet (VUV) lithography. Chamber 50 can contain any of numerous types of atmospheres, such as, nitrogen, etc. Alternatively, lithographic system 10 can be utilized in various other types of lithography including lithography that uses radiation at any number of wavelengths.

Lithographic system 10 includes a light source 22, a condenser lens assembly 24, a reticle or a mask 18, and an objective lens assembly 26. System 10 can utilize a number of reticles or masks similar to reticle or mask 18 to fabricate various structures, layers and regions on substrate 12. System 10 can utilize reticles or masks 18A and 18B discussed below with reference to FIGS. 2A and 2B.

A stage can support substrate 12 and can move substrate 12 with respect to lens assembly 26. System 10 can have a variety of configurations and arrangements. The configuration of system 10 shown in FIG. 1 is exemplary.

System 10 can include mirrors, beam splitters, and other components arranged according to other designs. System 10 can be embodied as a lithographic camera or stepper unit. An example of lithographic system 10 is a PAS5500/xxx series machine manufactured by ASML. Other examples include Microscan DUV systems by Silicon Valley Group or an XLS family Microlithography System by Integrated Solutions, Inc. of Korea.

Substrate 12 can include a layer of material 14 thereon. Layer of material 14 can be an insulative layer, a conductive layer, a barrier layer, or other layer of material which is to be etched, doped, or layered using the process described herein. In one embodiment, material 14 is a hard mask layer, such as, a silicon nitride layer, a metal layer, or other material. The hard mask layer can serve as a patterned layer for processing of substrate 12 or for processing a layer upon substrate 12. In another embodiment, material 14 is an anti-reflective coating (ARC).

Substrate 12 and layer of material 14 are not described in a limiting fashion. The principles of the present invention can be applied to any integrated circuit substrate, wafer, mask layer, or other layer. Substrate 12 and the layer of material 14 can be conductive, semiconductive, or insulative.

A layer of lithographic material, such as, a photoresist layer or material 16 is deposited over layer of material 14. Photoresist material 16 can comprise any of a variety of photoresist chemicals suitable for lithographic applications. Material 16 can be comprised of a matrix material or resin, a sensitizer or inhibitor, and a solvent. Photoresist material 16 is preferably a lowcontrast photoresist, but may alternatively be a high-contrast photoresist.

Photoresist material 16 is deposited by, for example, spin-coating over layer of material 14. Material 16 can be provided with a thickness of less than 1.0 microns. Photoresist material 16 may be either a positive photoresist or a negative photoresist and can be an organic or non-organic photoresist material.

Reticle or mask 18 is a binary mask in this exemplary embodiment. Reticle or mask 18 has a translucent substrate 21 preferably fabricated from glass or quartz, and an opaque layer 20, such as chromium or chromium oxide, patterned thereon. Alternatively, mask 18 can be an attenuating phase shift mask, an alternating phase shift mask, or other mask reticle. Opaque layer 20 is patterned to provide a desired circuit pattern to photoresist material 16. The pattern associated with reticles or masks 18A and 18B (FIGS. 2A and 2B) are described below in more detail. Although reticles or masks 18, 18A, 18B are shown in a mask configuration and system 10 is shown using a mask configuration, the principles of the present invention are fully suited to reticle configurations.

Light source 22 provides light or radiation (e.g., ultraviolet (UV) light) through mask 18 to photoresist layer 16. Light source 22 is an excimer laser in this exemplary embodiment having a wavelength of 365 nanometers (nm), 248 nm, 193 nm, or 157 nm. Alternatively, light source 22 may be any other light source having different wavelengths, including i-line deep ultra-violet (DUV), VUV, or extreme ultra-violet (EUV) wavelengths.

Figure 2A:
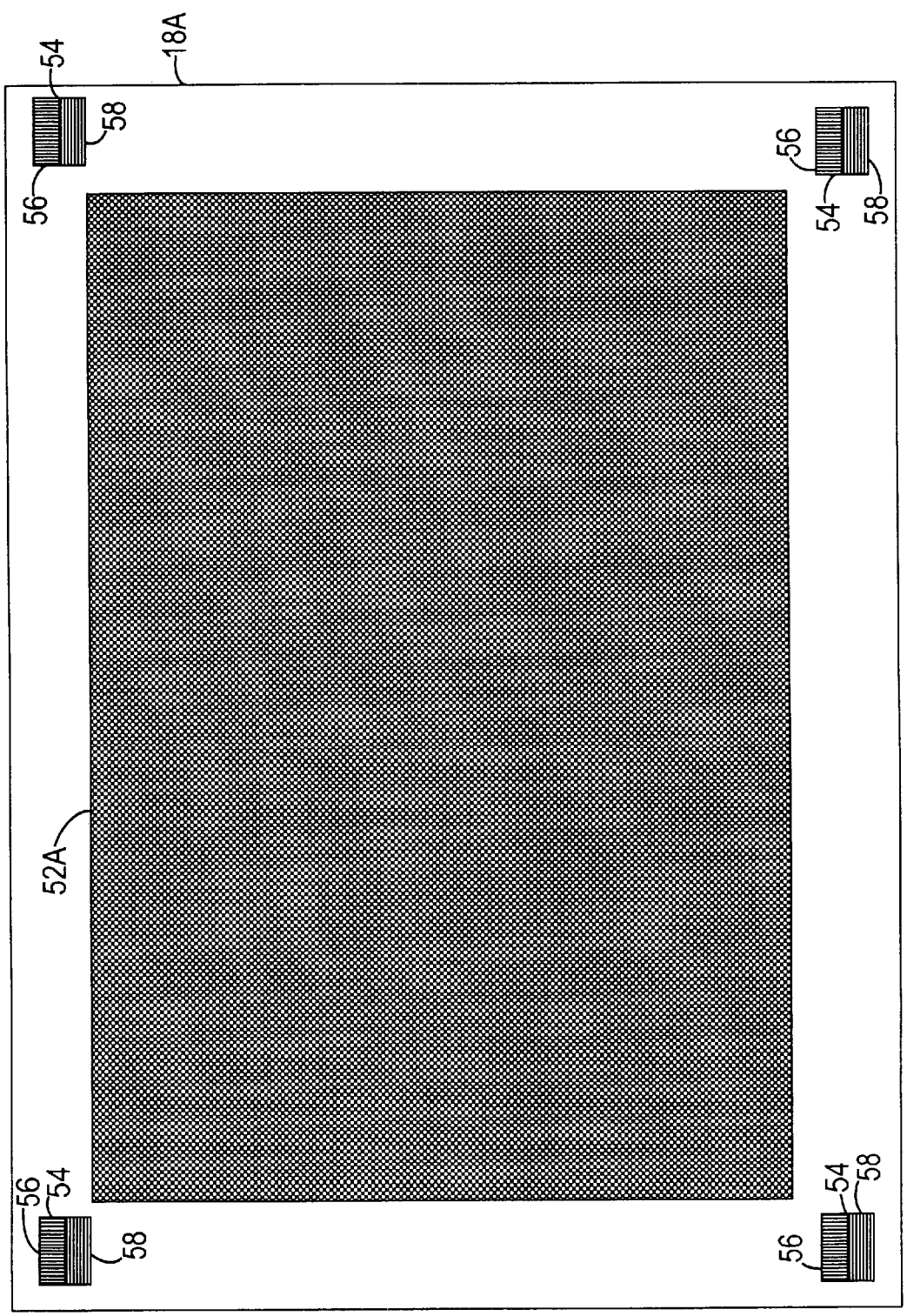
FIG. 2A is a schematic top planar view of a first reticle or mask for use in the system illustrated in FIG. 1, the first reticle or mask includes alignment marks in accordance with another exemplary embodiment.
Figure 2B:
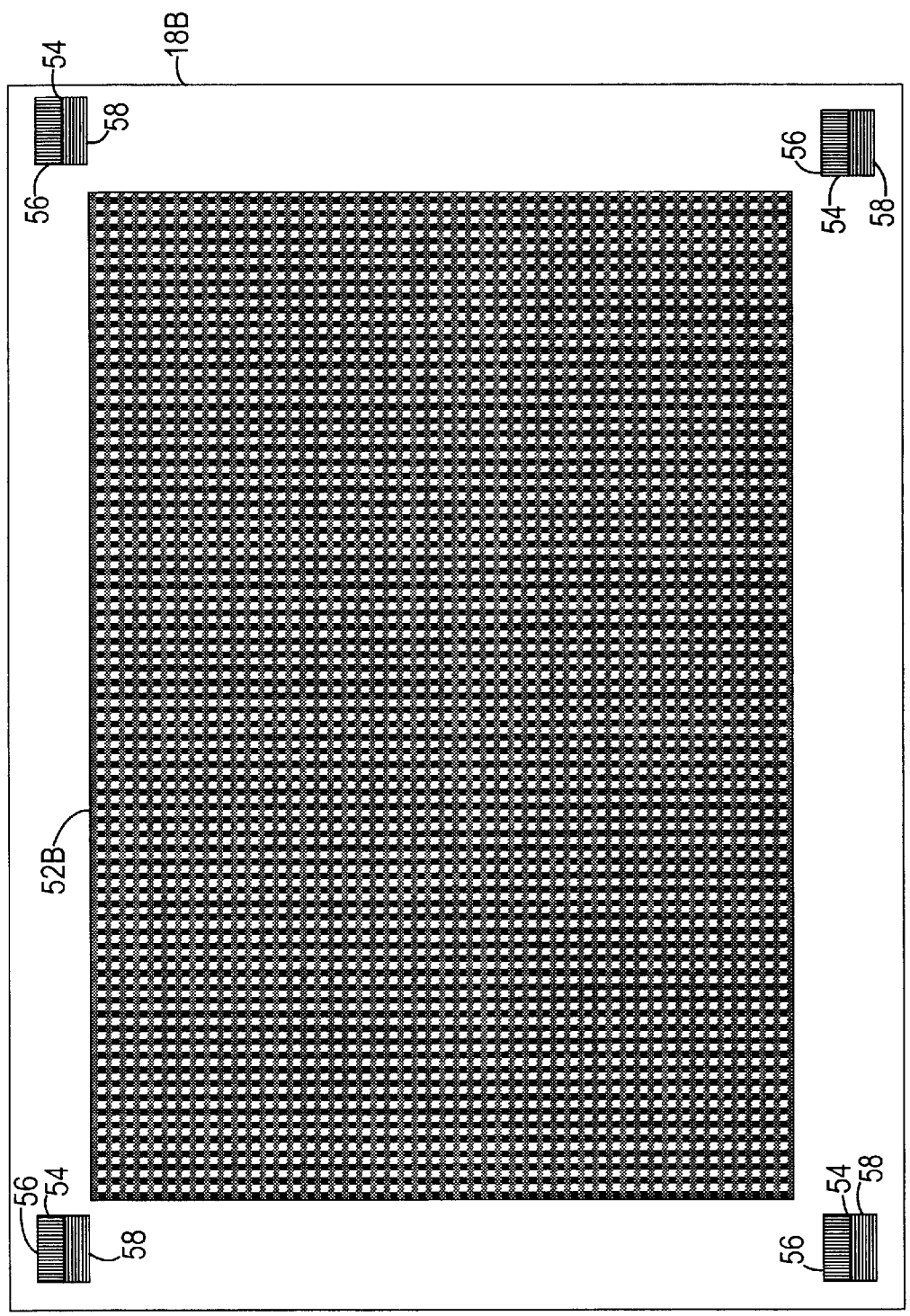
FIG. 2B is a schematic top planar view of a second reticle or mask for use in the system illustrated in FIG. 1, the second mask or reticle includes alignment marks in accordance with yet another exemplary embodiment.

With reference to FIGS. 2A and 2B, reticles or masks 18A or 18B can be utilized in lithographic system 10. Reticle or mask 18A (FIG. 2A) includes an integrated circuit pattern 52A, and reticle or mask 18B (FIG. 2B) includes an integrated circuit pattern 52B. Integrated circuit patterns 52A and 52B are shown in an exemplary manner only. Patterns 52A and 52B are preferably provided in a center portion of reticles or masks 18A and 18B, respectively.

Advantageously, reticles or masks 18A and 18B include alignment marks 54. Alignment marks 54 are essentially identical and are preferably provided in a peripheral region outside of patterns 52A and 52B. Marks 54 can be provided in the four corners associated with reticles or masks 18A and 18B.

Marks 54 preferably include a set of vertical bars 56 and a set of horizontal bars 58. Bars 56 and 58 are generally so small that they cannot be seen with the human eye (e.g., without the aid of a lens or other optical device). Marks 54 are preferably patterned onto substrate 12 (e.g., layer 16) with system 10 as discussed below. Preferably, patterning occurs first with mask 18A followed by mask 18B so that marks 54 of reticle or mask 18B are patterned over marks 54 of reticle or mask 18A.

Figure 3:
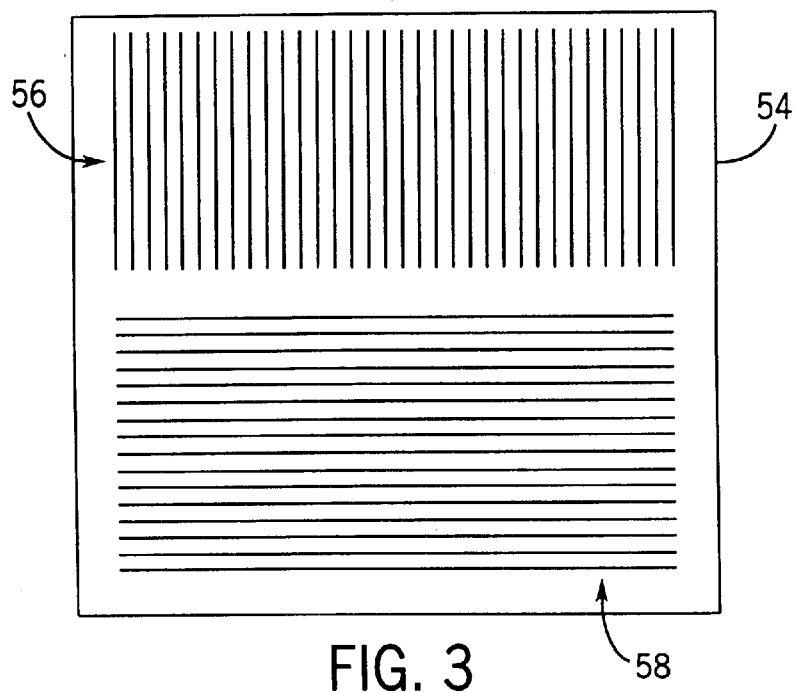
FIG. 3 is a more detailed schematic top planar view of alignment marks for at least one of the first reticle or mask illustrated in FIG. 2A and the second reticle or mask illustrated in FIG. 2B in accordance with still another exemplary embodiment.

With reference to FIG. 3, mark 54 is shown in more detail including vertical bars 56 and horizontal bars 58. Vertical bars 56 are configured to detect horizontal alignment errors, and horizontal bars 58 are configured to detect rotational and vertical alignment errors. Preferably, bars 56 are located above bars 58.

According to one exemplary embodiment, bars 56 and 58 can each have a width of 200 nm. The pitch or distance between individual bars can be 400 nm. The width to pitch ratio can be one-to-one, one-to-two, or other ratio depending upon design considerations. Bars 56 preferably have a length of 50 nm and bars 58 preferably have a length of 50 nm. Mark 54 can include 125 bars 56 and 125 bars 58. The specific structure of mark 54 with reference to FIG. 3 is an exemplary embodiment only. Other patterns can be utilized to achieve the advantageous results in the present invention.

Figure 4:
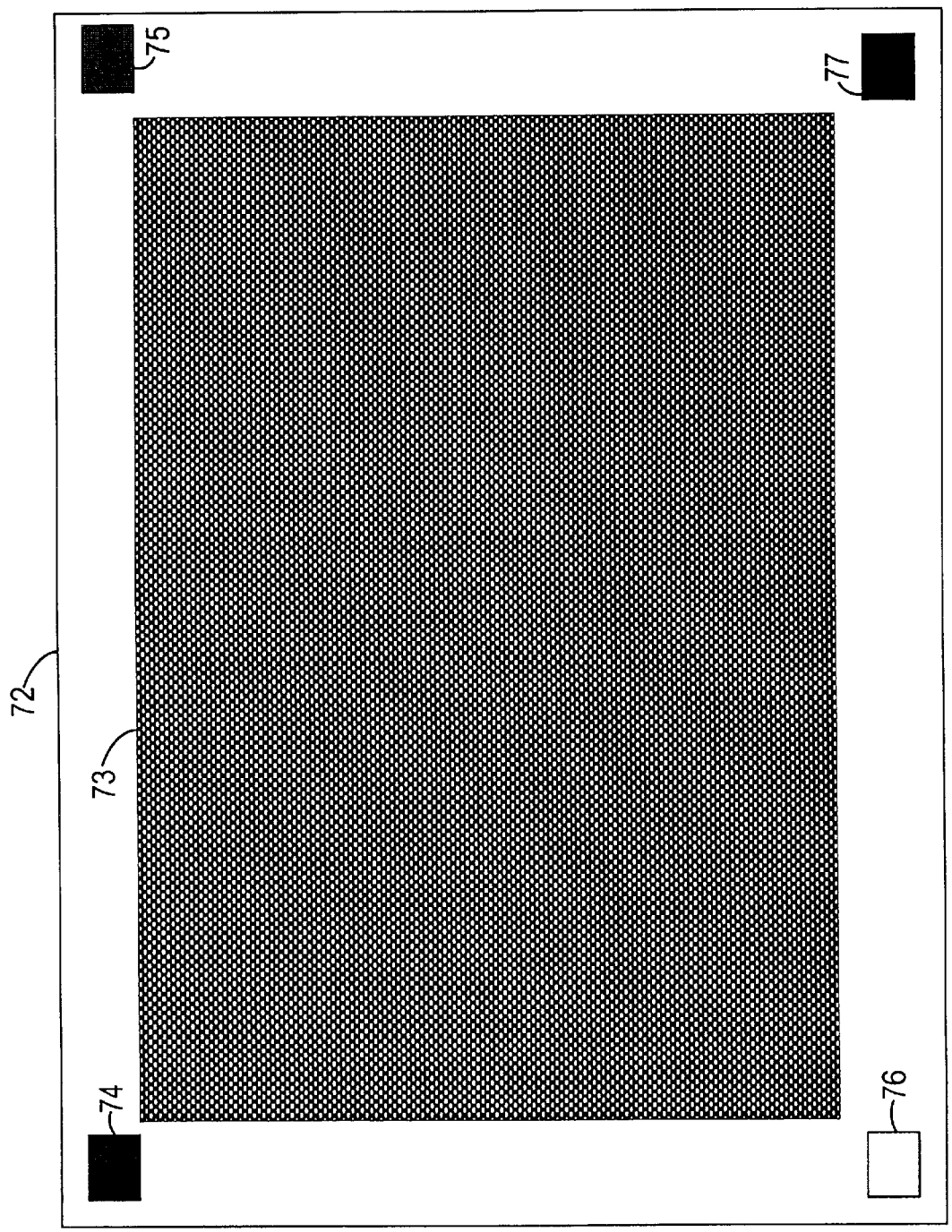
FIG. 4 is a schematic top planar view of a wafer patterned by the system illustrated in FIG. 1 using the first mask or reticle illustrated in FIG. 2A and the second mask or reticle illustrated in FIG. 2B, the wafer including wafer alignment marks indicating overlay errors in accordance with a further exemplary embodiment.

With reference to FIG. 4, a substrate 72 can be utilized as substrate 12 in FIG. 1. As shown in FIG. 4, substrate 72 has been subjected to a patterning process in system 10 during which integrated patterns 52A and 52B and alignment marks 54 associated with reticles or masks 18A and 18B have been provided to substrate 72. The combination of integrated circuit patterns 52A and 52B provide a combine integrated circuit pattern 73.

Substrate 72 also includes wafer alignment marks 74, 75, 76 and 77. Wafer alignment marks 74, 75, 76 and 77 a re associated with a combination of markings 54 of reticles or masks 18A and 18B. M arks 74, 75, 76 and 77 have moire patterns which are viewable by the human eye. Therefore, although each line associated with marks 74, 75, 76 and 77 i s not visible by the human eye (e.g., because of their narrowness), marks 74, 75, 76 and 77 are visible to the human eye.

As shown in FIG. 4, two factors related to marks 74, 75, 76 and 77 indicate an alignment error to the naked eye. Mark 77 is relatively darker than marks 74, 75 and 76. Similarly, mark 76 is lighter than marks 74, 75 or 77. The discrepancy in color between marks 74, 75, 76 and 77 indicates an alignment error. First, mark 77 is relatively dark, thereby indicating an alignment error. Second, marks 74, 75, 76 and 77 have different colors. The alignment error can be a vertical alignment error, a rotational alignment error, or a horizontal alignment error.

Figure 5:
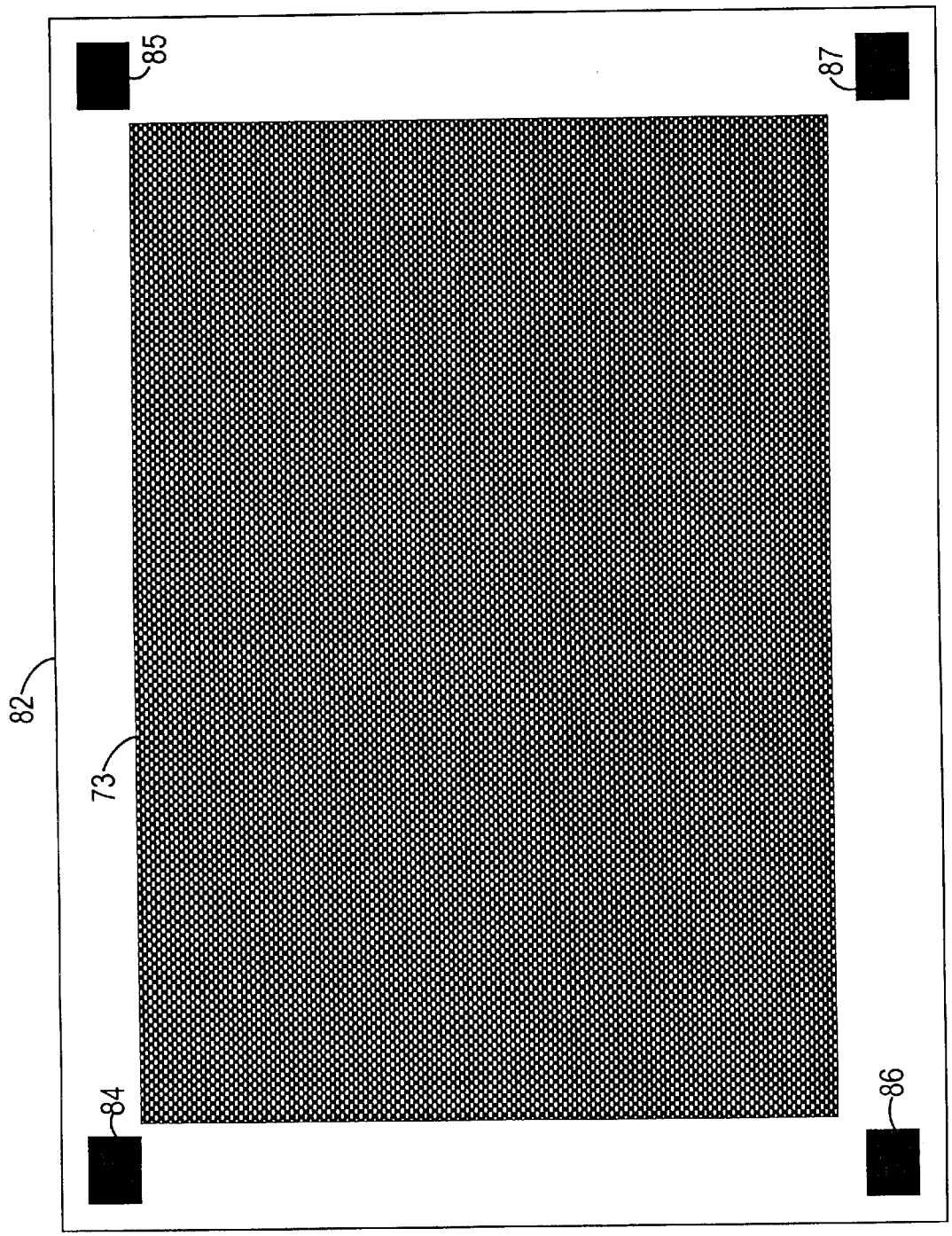
FIG. 5 is a schematic top planar view of a wafer patterned by the system illustrated in FIG. 1 using the first mask or reticle illustrated in FIG. 2A and the second mask or reticle illustrated in FIG. 2B, the wafer including wafer alignment marks indicating small or no overlay errors in accordance with yet a further exemplary embodiment.

With reference to FIG. 5, a substrate 82 is substantially similar to substrate 72 including combined IC pattern 73 and wafer alignment marks 84, 85, 86 and 87. Marks 84, 85, 86 and 87 are similar to marks 74, 75, 76 and 77. However, marks 84, 85, 86 and 87 have a similar color to each other and have a relatively light color, thereby indicating an absence or small level of alignment errors associated with reticles or masks 18A and 18B.

Figure 6:
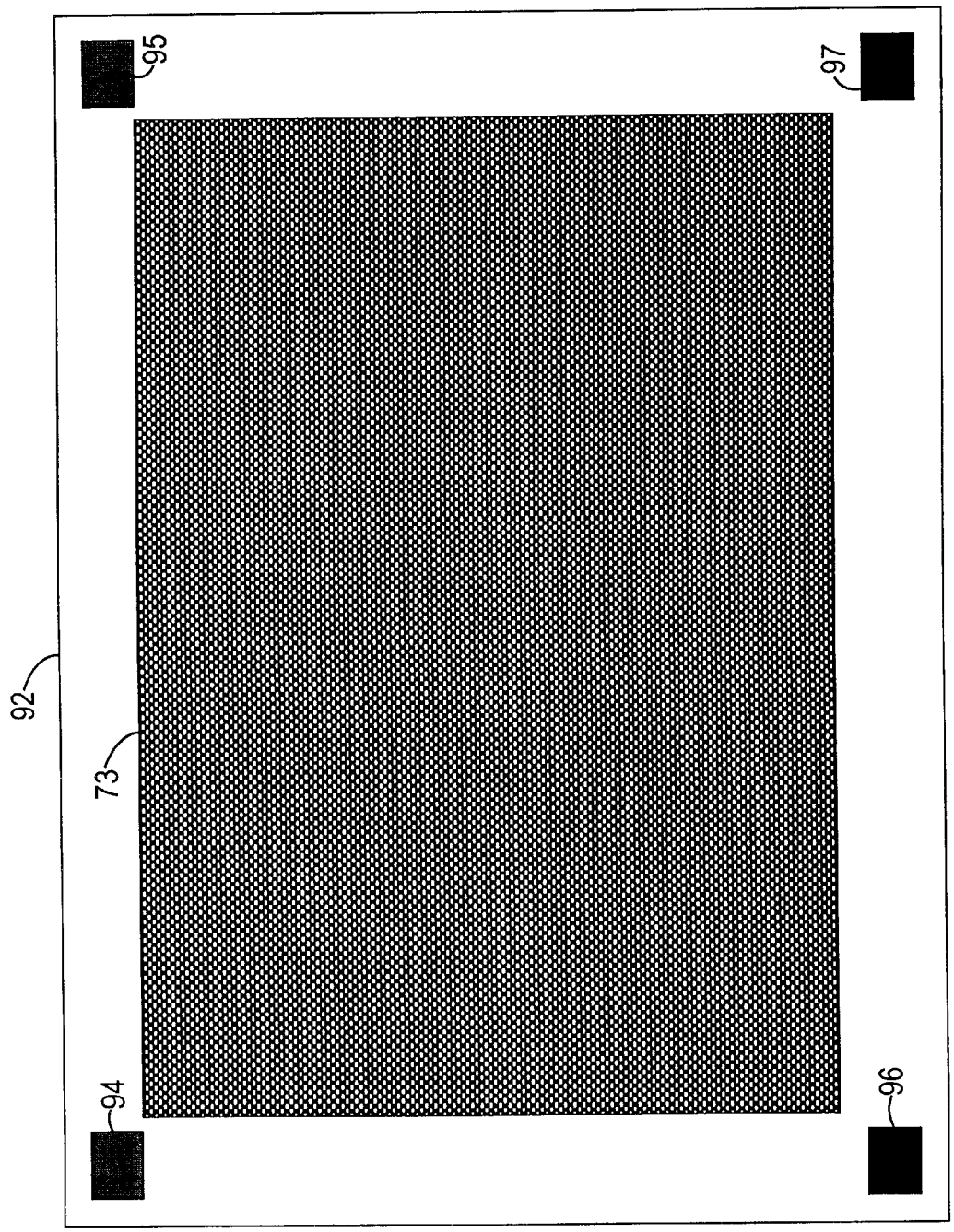
FIG. 6 is a schematic top planar view of a wafer patterned by the system illustrated in FIG. 1 using the first mask or reticle illustrated in FIG. 2A and the second mask or reticle illustrated in FIG. 2B, the wafer including wafer alignment marks indicating overlay errors in accordance with another exemplary embodiment.

With reference to FIG. 6, a substrate 92 is substantially similar to substrates 72 and 82. Substrate 92 includes combined integrated circuit pattern 73 and wafer alignment marks 94, 95, 96 and 97. Wafer alignment marks 96 and 97 are relatively dark, indicating the existence of an overlay error. In addition, wafer alignment marks 94 and 95 are a substantially different level of darkness than marks 96 and 97, also indicating the presence of an error. Marks 94, 95, 96 and 97 are similar to alignment marks 74, 75, 76 and 77 (FIG. 4) and alignment marks 84, 85, 86 and 87 (FIG. 5).

With reference to FIGS. 7–10, an exemplary process for patterning at least a portion 111 of substrate 12 is described below as follows.

Substrate 12 can be patterned in system 10 (FIG. 1) utilizing reticles or masks 18A–B. The patterning of portion 111 including wafer alignment marks 174 (FIG. 10) is only discussed below for simplicity.

Photoresist material 16 is disposed above substrate 12. Photoresist material 16 can be applied by a spin coating machine, such as, an automated in-line wafer spin coater. For example, substrate 12 can be rotated to a speed of 2000–3000 rpm while photoresist material 16 is applied. In one embodiment, photoresist material 16 is a 0.1 to 1.0 micron thick layer.

Substrate 12 may be cleaned and primed before the application of material 16. In addition, an anti-reflective coating can be provided above substrate 12 before material 16 is applied.

Figure 8:
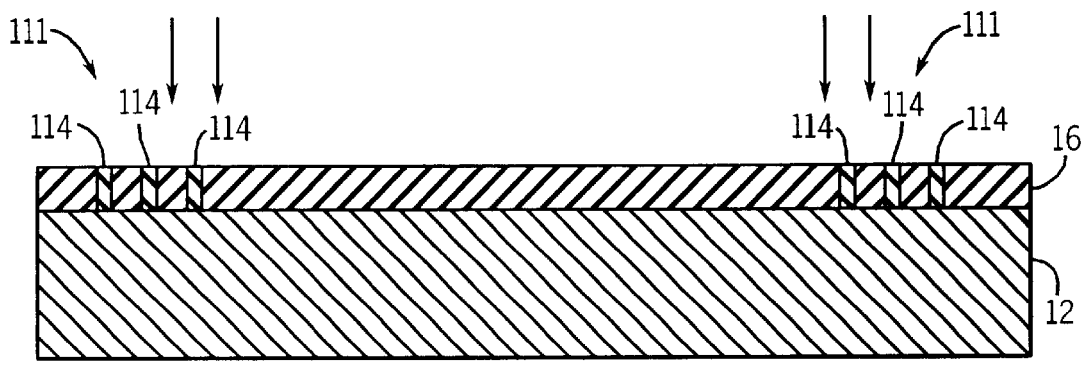
FIG. 8 is a schematic cross-sectional view of the wafer illustrated in FIG. 7, the wafer patterned with the mask or reticle illustrated in FIG. 2A by the lithographic system illustrated in FIG. 1, in accordance with yet another exemplary embodiment.

With reference to FIG. 8, light source 22 (FIG. 1) provides an exposure of light or radiation through reticle or mask 18A to selectively expose portion 111 of photoresist material 16. The exposed sections 114 associated with alignment marks 54 (FIG. 2A) of reticle or mask 18A are formed in material 16. Exposed sections 114 can have a width of approximately 10 percent of the width of bars 56 (e.g., 10 nm) and are spaced approximately 10 percent of the distance between bars 56 (e.g., 20 nm).

For example, in chamber 50 of system 10, a predetermined amount of light energy, typically measured in mJ/cm$^2$ (millijoules per square centimeter), is provided to photoresist material 16. This predetermined amount of light energy provided to material 16 is a factor of the intensity of light source 22, the duration of the light provided, the wavelength of the light, the composition of photoresist material 16, and any attenuation provided by mask 18A. For example, between 10 and 15 mJ/cm$^2$ can be applied in this first exposure step, using light source 22 having a 248 nm wavelength. In this exemplary embodiment, a positive photoresist material 16 is utilized, and sufficient light energy is provided through mask or reticle 18A to chemically change material 16 to form sections 114.

Figure 9:
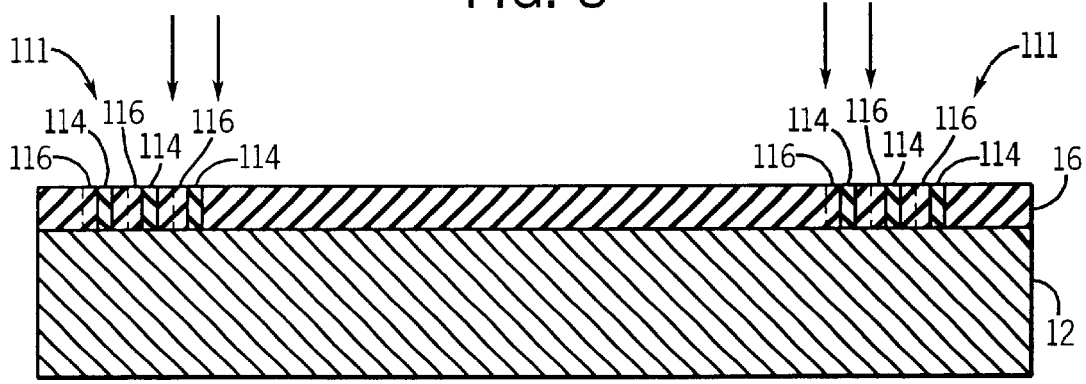
FIG. 9 is a schematic cross-sectional view of the wafer illustrated in FIG. 8, the wafer patterned with the mask or reticle illustrated in FIG. 2B by the lithographic system illustrated in FIG. 1, in accordance with still another exemplary embodiment.

With reference to FIG. 9, light source 22 (FIG. 1) provides an exposure of light or radiation through reticle or mask 18B to selectively expose portion II of photoresist material 16. Exposed sections 116 associated with alignment mark 54 (FIG. 2B) of reticle or mask 18B are formed in material 16. Exposed sections 116 can have a width of approximately 10 percent of the width of bars 56 (e.g., 10 nm) and are spaced approximately 10 percent of the distance between bars 56 (e.g., 20 nm).

For example, in chamber 50 of system 10, a predetermined amount of light energy, typically measured in mJ/cm$^2$ (millijoules per square centimeter), is provided to photoresist material 16. This predetermined amount of light energy provided to material 16 is a factor of the intensity of light source 22, the duration of the light provided, the wavelength of the light, the composition of photoresist material 16, and any attenuation provided by mask 18B. For example, between 10 and 15 mJ/cm$^2$ can be applied in this second exposure step, using light source 22 having a 248 nm wavelength. In this exemplary embodiment, a positive photoresist material 16 is utilized and sufficient light energy is provided through reticle or mask 18B to chemically change material 16 to form sections 116.

Figure 10:
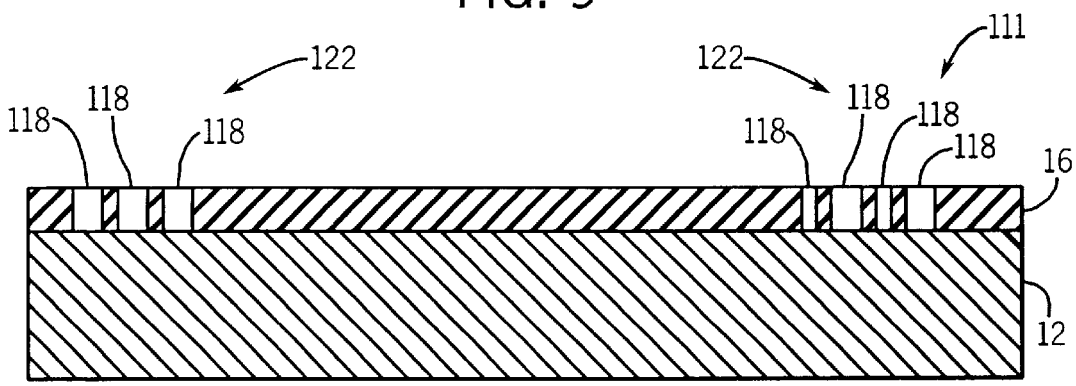
FIG. 10 is a schematic cross-sectional view of the wafer illustrated in FIG. 9, the wafer developed to form wafer alignment marks, in accordance with a further exemplary embodiment.

With reference to FIG. 10, an emersion, puddling, or spray technique can be utilized to develop material 16. As can be seen, an alignment error or overlay error appears to exist, since sections 114 and 116 are not directly on top of each other. This alignment error will be manifested after material layer 16 has been developed. Any type of lithographic technology can be used to pattern material 16 to form sections 114 and 116. For example, UV, DUV, VUV, or EUV lithographic equipment can be used to pattern photoresist material 16. A developer solution is provided to remove the portion associated with sections 114 and 116. The developer solution is typically a solvent which renders sections 114 and 116 soluble after being exposed to a sufficient amount of light energy. Sections 114 and 116 can be associated with bars 56 of marks 54 of reticles or masks 18A and 18B, respectively. After development, material 16 includes trenches 118 associated with sections 114 and 116. As can be seen, trenches 118 on a left side 122 will appear darker than trenches 118 on a right side 120. This difference in coloration indicates an alignment error.

Figure 11:
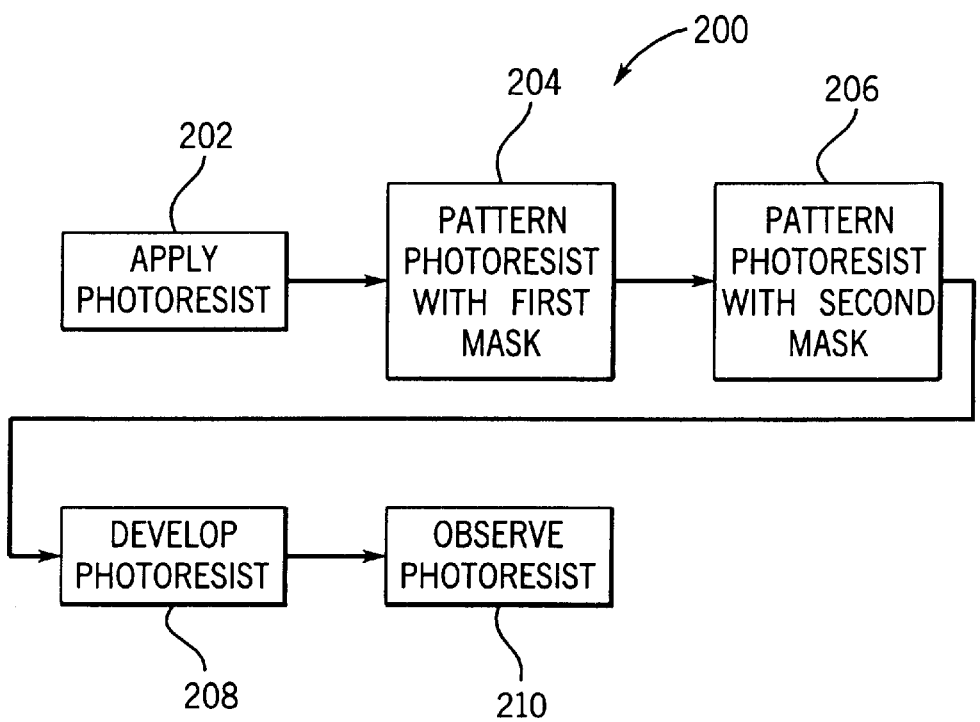
FIG. 11 is a flow diagram showing a process for detecting overlay or alignment errors between masks or reticles, in accordance with yet another exemplary embodiment.
Figure 7:
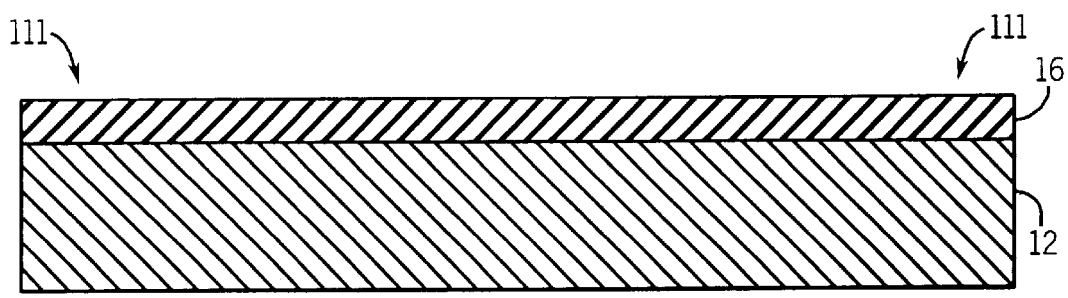
FIG. 7 is a schematic cross-sectional view of the wafer illustrated in FIG. 1, the wafer includes a photoresist material for patterning by the lithographic system illustrated in FIG. 1, in accordance with an exemplary embodiment.

With reference to FIG. 11, an exemplary flow diagram 200 is described. At a step 202, substrate 12 or a layer above substrate 12 is covered by photoresist material 16 (FIG. 7). At a step 204, substrate 12 is placed in a chamber and exposed to radiation via reticle or mask 18A. The exposure of radiation provides photochemical reactions in material 16 (FIG. 8).

At a step 206, substrate 12 is exposed to radiation via reticle or mask 18B. The exposure of radiation provides additional photochemical reactions in material 16 (FIG. 9).

At a step 108, material 16 is developed in accordance with a conventional development process to form trenches 118 (FIG. 10) (wafer marks 74, 75, 76 and 77 (FIG. 4), wafer marks 84, 85, 86, and 87 (FIG. 5), or wafer marks 94, 95, 96, and 97 (FIG. 6)). At a step 210, marks 74, 75, 76, 77 or marks 84, 85, 86, 87, or marks 94, 95, 96, 97 are observed with the naked eye to determine if any overlay errors exist. The moire effect associated with wafer marks 74, 75, 76, and 77, marks 84, 85, 86, and 87, or marks 94, 95, 96, and 97 can be seen by the naked eye even though the individual bars associated with those marks are not visible to the naked eye.

While the embodiments illustrated in the figures and described above are presently preferred, it should be understood that these embodiments are offered by way of example only. For example, trenches or spaces in photoresist material 16 may be created in any of a variety of manners. The invention is not limited to a particular embodiment, but extends to various modifications, combinations, and permutations that nevertheless fall within the scope and spirit of the appended claims.

What is claimed is:

1. A method of observing alignment errors between a first mask or reticle and a reticle and a second mask or reticle for fabricating an integrated circuit, the method comprising steps of:

providing a photoresist layer over a semiconductor substrate;

providing a first pattern of radiation to an area of the photoresist layer with the first mask or reticle, the first pattern of radiation including a plurality of second alignment marks;

providing a second pattern of radiation to the area of the photoresist layer with the second mask or reticle, the second pattern of radiation including a plurality of second alignment marks;

developing the photoresist layer to reveal a plurality of wafer alignment marks, the wafer alignment marks being related to a combination of the first alignment marks and the second alignment marks; and observing the darkness of the wafer alignment marks.

2. The method of claim 1, wherein the first alignment marks and the second alignment marks have an identical pattern.

3. The method of claim 2, wherein the identical pattern includes horizontal and vertical bars.

4. The method of claim 3, wherein the horizontal bars are 200 nm wide and spaced apart by 400 nm or less.

5. The method of claim 3, wherein the vertical bars are located below the horizontal bars.

6. The method of claim 1, wherein the first alignment marks are disposed at corners of the first mask or reticle.

7. The method of claim 1, wherein the darkness is related to a moire effect.

8. The method of claim 1, wherein the observing step includes observing a difference in darkness between the wafer alignment marks.

9. The method of claim 1, wherein the first mask or reticle is an EUV mask or reticle.

10. A method of determining an overlay error between a pair of masks or reticles used to fabricate an integrated circuit, the method comprising:

providing a pattern of radiation to an area above a substrate with a first mask or reticle;

providing a pattern of radiation to the area above the substrate with a second mask or reticle; and providing a plurality of alignment features on the substrate, the alignment features being related to the first mask or reticle and the second mask or reticle, wherein a characteristic of the alignment features can be observed via the naked eye to determine the overlay error between the first mask or reticle and the second mask or reticle.

11. The method of claim 10, wherein the characteristic is related to a color or darkness of the alignment features.

12. The method of claim 10, wherein the alignment features are provided on corners of the substrate.

13. The method of claim 12, wherein the alignment features include vertical and horizontal bars.

14. The method of claim 13, wherein the alignment features each include at least ten horizontal bars and at least ten vertical bars.

15. The method of claim 14, wherein the horizontal bars are 200 nm wide and the vertical bars are 200 nm wide.

16. A method of determining an overlay error with the naked eye between a first mask or reticle and a second mask or reticle utilized to fabricate an integrated circuit, the method comprising:

forming a set of alignment marks on a substrate, the alignment marks being related to alignment patterns associated with the first mask or reticle and the second mask or reticle provided to an area of the substrate, the set of alignment marks having a darkness characteristic related to the overlay error; and observing the darkness characteristic of the alignment marks with the naked eye.

17. The method of claim 16, wherein the alignment marks are provided on a peripheral area of the substrate.

18. The method of claim 16, wherein the alignment marks are relatively light when the overlay error is small.

19. The method of claim 16, wherein the alignment marks include a plurality of vertical and horizontal bars.

20. The method of claim 19, wherein the horizontal bars are 200 nm wide and spaced apart by 400 nm.

* * * * *

UNITED STATES PATENT AND TRADEMARK OFFICE
CERTIFICATE OF CORRECTION

PATENT NO.     : 6,489,068 B1
DATED          : December 3, 2002
INVENTOR(S)    : Jongwook Kye It is certified that error appears in the above-identified patent and that said Letters Patent is hereby corrected as shown below:

Column 8,
Line 39, delete "second" and replace with -- first --.

Signed and Sealed this

Eighth Day of April, 2003

JAMES E. ROGAN
*Director of the United States Patent and Trademark Office*